United States Patent
Cheng et al.

(10) Patent No.: US 9,583,378 B2
(45) Date of Patent: Feb. 28, 2017

(54) FORMATION OF GERMANIUM-CONTAINING CHANNEL REGION BY THERMAL CONDENSATION UTILIZING AN OXYGEN PERMEABLE MATERIAL

(71) Applicant: International Business Machines Corporation, Armonk, NY (US)

(72) Inventors: Kangguo Cheng, Schenectady, NY (US); Ali Khakifirooz, Mountain View, CA (US); Alexander Reznicek, Troy, NY (US); Ghavam G. Shahidi, Pound Ridge, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/267,520

(22) Filed: May 1, 2014

(65) Prior Publication Data

US 2015/0318216 A1    Nov. 5, 2015

(51) Int. Cl.
*H01L 21/02* (2006.01)
*H01L 21/324* (2006.01)
(Continued)

(52) U.S. Cl.
CPC ...... *H01L 21/762* (2013.01); *H01L 21/02164* (2013.01); *H01L 21/02255* (2013.01);
(Continued)

(58) Field of Classification Search
CPC ......... H01L 21/02164; H01L 21/02255; H01L 21/02532; H01L 21/02612; H01L 21/0262;
(Continued)

(56) References Cited

U.S. PATENT DOCUMENTS 8,623,728 B2 *   1/2014   Chang ................... H01L 29/165
                                                           438/285
8,828,818 B1 *   9/2014   Rodder ............. H01L 29/66795
                                                          257/E21.182
(Continued)

FOREIGN PATENT DOCUMENTS

EP    1 542 275       * 10/2003    ............. H01L 21/62
EP    1542275          6/2005
WO   WO 2006/117734   11/2006

OTHER PUBLICATIONS

Yin, H., et al., "High-germanium-content SiGe islands formed on compliant oxide by SiGe oxidation", Applied Physics Letters, May 3, 2004, vol. 84, No. 18, pp. 3624-3626.*

(Continued)

*Primary Examiner* — Marc Armand
*Assistant Examiner* — Younes Boulghassoul
(74) *Attorney, Agent, or Firm* — Scully, Scott, Murphy & Presser, P.C.; Daniel P. Morris, Esq.

(57) ABSTRACT

A structure including a first semiconductor material portion and a second semiconductor material portion is provided. An oxygen impermeable hard mask is then formed directly on a surface of the first semiconductor material portion. Next, a silicon germanium layer is epitaxially formed on the second semiconductor material portion, but not the first semiconductor material portion. An oxygen permeable hard mask is then formed over the first and second semiconductor material portions. A thermal condensation process is then performed which converts the second semiconductor material portion into a germanium-containing semiconductor material portion. The oxygen permeable hard mask and the oxygen impermeable hard mask are then removed. A functional gate structure can be formed atop the remaining first (Continued)

semiconductor material portion and the thus formed germanium-containing semiconductor material portion.

20 Claims, 9 Drawing Sheets

(51) Int. Cl.
*H01L 21/8238* (2006.01)
*H01L 21/762* (2006.01)
*H01L 21/3105* (2006.01)
*H01L 21/84* (2006.01)

(52) U.S. Cl.
CPC .. *H01L 21/02532* (2013.01); *H01L 21/02612* (2013.01); *H01L 21/31051* (2013.01); *H01L 21/324* (2013.01); *H01L 21/76224* (2013.01); *H01L 21/823807* (2013.01); *H01L 21/823821* (2013.01); *H01L 21/823828* (2013.01); *H01L 21/823878* (2013.01); *H01L 21/84* (2013.01); *H01L 21/845* (2013.01); *H01L 21/0262* (2013.01); *H01L 21/02664* (2013.01)

(58) Field of Classification Search
CPC ........... H01L 21/02664; H01L 21/0245; H01L 21/31051; H01L 21/324; H01L 21/762; H01L 21/76224; H01L 21/823807; H01L 21/823821; H01L 21/823828; H01L 21/823878; H01L 21/84; H01L 21/845; H01L 27/12; H01L 29/49; H01L 29/78; H01L 29/786
USPC ........ 257/295, 350, 351; 438/151, 154, 218, 438/260, 275, 285, 480
See application file for complete search history.

(56) References Cited

U.S. PATENT DOCUMENTS

| | | | |
|---|---|---|---|
| 8,987,069 B1* | 3/2015 | Adam | H01L 29/161 117/105 |
| 2004/0238885 A1 | 12/2004 | Bedell et al. | |
| 2011/0108920 A1* | 5/2011 | Basker et al. | 257/351 |
| 2011/0147811 A1* | 6/2011 | Kavalieros | H01L 29/66795 257/288 |
| 2013/0099319 A1* | 4/2013 | Adam et al. | 257/351 |
| 2014/0011328 A1* | 1/2014 | Bedell | H01L 21/823807 438/154 |
| 2014/0339638 A1* | 11/2014 | Cheng | H01L 27/1203 257/347 |
| 2015/0145048 A1* | 5/2015 | Cheng | H01L 27/1211 257/351 |

OTHER PUBLICATIONS

T. Tezuka et al., "Dislocation-free formation of relaxed SiGe-on-insulator layers", Applied Physics Letters, vol. 80, p. 3560-3562, (2002).*
Balakumar, S., et al., "Fabrication of Thick Germanium-on-Insulator (GeOI) Substrates", Journal of Electronic Materials, Jun. 2008, vol. 37, No. 7, pp. 944-950.
Hong, S., et al., "Formation of flat, relaxed Si1-x Gex alloys on Si (001) without buffer layers", Applied Physics Letters, Jan. 2006, vol. 88, pp. 122103-1 to 122103-3.
Li, C., et al., "Properties of ultra-thin SiGe-on-insulator materials prepared by Ge condensation method", Phys. Status Solidi C 9, Article first published online: Jul. 25, 2012, No. 10-11, pp. 2027-2030.
Yin, H., et al., "High Ge-Content Relaxed Si1-xGex Layers by Relaxation on Compliant Substrate with Controlled Oxidation", 44th Electronic Materials Conference, Jun. 26-28, 2002, Santa Barbara, CA.

* cited by examiner

FORMATION OF GERMANIUM-CONTAINING CHANNEL REGION BY THERMAL CONDENSATION UTILIZING AN OXYGEN PERMEABLE MATERIAL

BACKGROUND

The present application relates to semiconductor device manufacturing, and more particularly, to a method of forming a semiconductor structure containing different channel materials within different device regions of a semiconductor structure.

For more than three decades, the continued miniaturization of metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, further methods for improving performance in addition to scaling have become critical.

One challenge facing continued size reduction is developing high performance MOSFET devices with smaller gate lengths. One approach to increase performance with smaller gate lengths is to increase the carrier mobility, i.e., electron and/or hole, in the channel. Although it is possible to obtain higher carrier mobilities with strained silicon, much higher mobilities can be achieved by using a different semiconductor material in the channel other than silicon. For example, hole mobility in silicon germanium (SiGe) is known to be much higher than in silicon.

In certain technology node device requirements, it may be necessary to provide a substrate that contains different channel materials in which n-field effect transistor (nFET) and p-field effect transistor (FET) devices can be formed. For example, enhanced device performance can be obtained by forming an nFET device on a silicon channel material, while forming a pFET device on a SiGe channel material.

SUMMARY

A structure including a first semiconductor material portion and a second semiconductor material portion is provided. An oxygen impermeable hard mask is then formed directly on a surface of the first semiconductor material portion. Next, a silicon germanium layer is epitaxially formed on the second semiconductor material portion, but not the first semiconductor material portion. An oxygen permeable hard mask is then formed over the first and second semiconductor material portions. A thermal condensation process is then performed which converts the second semiconductor material portion into a germanium-containing semiconductor material portion. The oxygen permeable hard mask and the oxygen impermeable hard mask are then removed. A functional gate structure can be formed atop the remaining first semiconductor material portion and the thus formed germanium-containing semiconductor material portion. In some embodiments, the functional gate structure formed on the first semiconductor material portion is an nFET, while the functional gate structure formed on the germanium-containing semiconductor material portion is a pFET.

In one aspect of the present application, a method of forming a semiconductor structure having different channel materials is provided. The method of the present application includes providing a structure including a first semiconductor material portion and a second semiconductor material portion located on a surface of a substrate. An oxygen impermeable hard mask is formed directly on a surface of the first semiconductor material portion, but not the second semiconductor material portion. A silicon germanium layer is epitaxially formed directly on a surface of the second semiconductor material portion. Next, an oxygen permeable hard mask is formed over the first and second semiconductor material portions. A thermal condensation process is now performed. During the thermal condensation process, the second semiconductor material portion is converted into a germanium-containing semiconductor material portion. Following the thermal condensation process, the oxygen permeable hard mask and the oxygen impermeable hard mask are removed from the structure.

DETAILED DESCRIPTION

Figure 1:
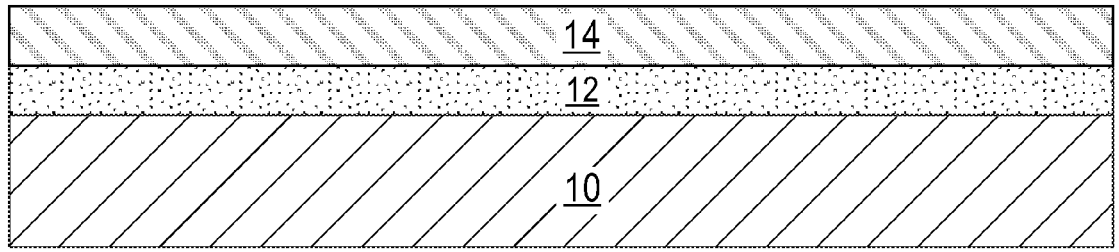
FIG. 1 is a cross sectional view of a first exemplary semiconductor structure including, from bottom to top, a handle substrate, a buried insulator layer and a semiconductor material layer that can be employed in one embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals with the drawings and various embodiments of the present application.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

As mentioned above, and in certain technology node device requirements, it may be necessary to provide a substrate that contains different channel materials in which n-field effect transistor (nFET) and p-field effect transistor (FET) devices can be formed. For example, enhanced device performance can be obtained by forming an nFET device on a silicon channel material, while forming a pFET device on a SiGe channel material. In the prior art, such a substrate can be formed by a process in which a SiGe layer is first formed directly on a surface of a silicon semiconductor material portion. A thermal condensation process can then be performed. During the thermal condensation process, germanium migrates from the SiGe layer downwards into the Si material portion and converts the Si material portion into a SiGe material portion. One problem with the prior art process is that thermal condensation causes undesired agglomeration of the various semiconductor material portions. The present application provides a method for overcoming the agglomeration problem that is observed utilizing prior art processes.

Notably, the present application overcomes the agglomeration problem by utilizing two different hard masks, e.g., an oxygen impermeable hard mask and an oxygen permeable hard mask. In accordance with the present application, an oxygen impermeable hard mask is formed only atop a semiconductor material portion in which conversion of the semiconductor material portion into a germanium-containing semiconductor material portion is not desired. After forming the oxygen impermeable hard mask, a SiGe layer is formed directly on a surface of a semiconductor material portion in which conversion into a germanium-containing semiconductor material portion is desired. The oxygen impermeable hard mask blocks SiGe epitaxy as well as oxygen diffusion into the semiconductor material portion. Next, an oxygen permeable hard mask is formed over the entire structure. A thermal condensation process is then performed. The oxygen impermeable hard mask that is formed on a surface of the SiGe layer prevents SiGe agglomeration during the thermal condensation process while allowing oxygen to diffuse into the semiconductor material portion that is located directly beneath the SiGe layer.

Referring first FIG. 1, there is illustrated a first exemplary semiconductor structure including, from bottom to top, a handle substrate 10, an insulator layer 12 and a semiconductor material layer 14 that can be employed in accordance with an embodiment of the present application. Collectively, the handle substrate 10, the insulator layer 12 and the semiconductor material layer 14 may be referred to as a semiconductor-on-insulator (SOI) substrate.

Although the present application is described and illustrated utilizing an SOI substrate, other semiconductor substrates can also be used including, for example, a semiconductor substrate in which handle substrate 10 is omitted, or a bulk semiconductor substrate in which the entirety of the semiconductor substrate is comprised of a semiconductor material.

In the embodiment illustrated in FIG. 1, the semiconductor material layer 14 is present on an uppermost surface of the insulator layer 12. The insulator layer 12 is present on an uppermost surface of the handle substrate 10. The handle substrate 10 provides mechanical support to the insulator layer 12 and the semiconductor material layer 14.

In some embodiments of the present application, the handle substrate 10 and the semiconductor material layer 14 of the SOI substrate may comprise a same semiconductor material. In other embodiments of the present application, the handle substrate 10 and the semiconductor material layer 14 of the SOI substrate may comprise a different semiconductor material. The term "semiconductor" as used herein in connection with the semiconductor material of the handle substrate 10 and the semiconductor material layer 14 denotes any silicon-containing semiconducting material including, for example, Si, SiGe, SiC, and SiGeC. Multilayers of these silicon-containing semiconductor materials can also be used as the semiconductor material of the handle substrate 10 and the semiconductor material layer 14. In one embodiment, the handle substrate 10 and the semiconductor material layer 14 are both comprised of silicon. In some embodiments, the handle substrate 10 is a non-semiconductor material including, for example, a dielectric material and/or a conductive material.

The handle substrate 10 and the semiconductor material layer 14 may have the same or different crystal orientation. For example, the crystal orientation of the handle substrate 10 and/or the semiconductor material layer 14 may be {100}, {110}, or {111}. Other crystallographic orientations besides those specifically mentioned can also be used in the present application. The handle substrate 10 and/or the semiconductor material layer 14 of the SOI substrate may be a single crystalline semiconductor material, a polycrystalline material, or an amorphous material. Typically, at least the semiconductor material layer 14 is a single crystalline semiconductor material. In some embodiments, the semiconductor material layer 14 that is located atop the insulator layer 12 can be processed to include semiconductor regions having different crystal orientations.

The insulator layer 12 of the SOI substrate may be a crystalline or non-crystalline oxide or nitride. In one embodiment, the insulator layer 12 is an oxide such as, for example, silicon dioxide. The insulator layer 12 may be continuous or it may be discontinuous. When a discontinuous insulator region is present, the insulator region exists as an isolated island that is surrounded by semiconductor material.

The SOI substrate may be formed utilizing standard processes including for example, SIMOX (separation by ion implantation of oxygen) or layer transfer. When a layer transfer process is employed, an optional thinning step may follow the bonding of two semiconductor wafers together. The optional thinning step reduces the thickness of the semiconductor layer to a layer having a thickness that is more desirable.

The thickness of semiconductor material layer 14 of the SOI substrate is typically from 10 nm to 100 nm, with a thickness from 50 nm to 70 nm being more typical. In some embodiments, and when an ETSOI (extremely thin semiconductor-on-insulator) substrate is employed, semiconductor material layer 14 of the SOI can have a thickness of less than 10 nm. If the thickness of the semiconductor material layer 14 is not within one of the above mentioned ranges, a thinning step such as, for example, planarization or etching can be used to reduce the thickness of semiconductor material layer 14 to a value within one of the ranges mentioned above. The insulator layer 12 of the SOI substrate typically has a thickness from 1 nm to 200 nm, with a thickness from 100 nm to 150 nm being more typical. The thickness of the handle substrate 10 of the SOI substrate is inconsequential to the present application.

The semiconductor material layer 14 may be doped, undoped or contain doped and undoped regions therein. For clarity, the doped regions are not specifically shown in the drawings of the present application. Each doped region within the semiconductor material layer 14 may have the same, or they may have different conductivities and/or doping concentrations. The doped regions that are present in the semiconductor material layer 14 can be formed by ion implantation process or gas phase doping.

Figure 2:
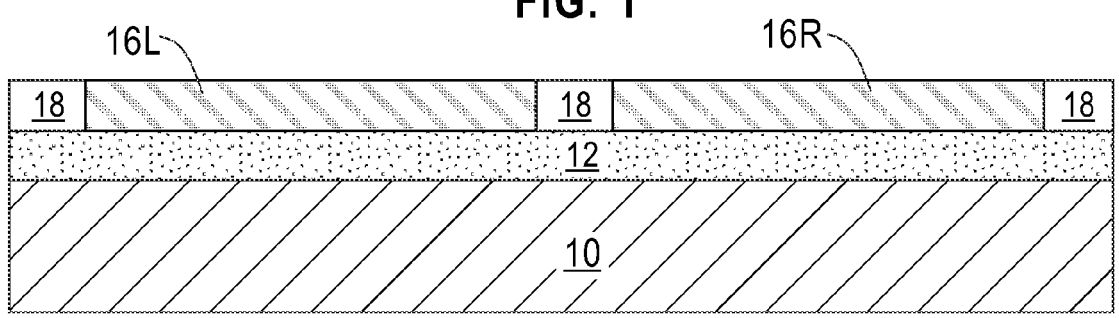
FIG. 2 is a cross sectional view of the first exemplary semiconductor structure of FIG. 1 after forming a first semiconductor material portion and a second semiconductor material portion within the semiconductor material layer.

Referring now to FIG. 2, there is illustrated the first exemplary semiconductor structure of FIG. 1 after forming a first semiconductor material portion 16L and a second semiconductor material portion 16R within the semiconductor material layer 14. In this embodiment of the present application, the first semiconductor material portion 16L and second semiconductor material portion 16R are thin planar films located on a surface of the insulator layer 12. Although a single first semiconductor material portion 16L and a single second semiconductor material portion 16R are described and illustrated, a plurality of first semiconductor material portions and a plurality of second semiconductor material portions can be formed.

In some embodiments of the present application, the first semiconductor material portion 16L and the second semiconductor material portion 16R can define different semiconductor device regions. For example, the first semiconductor material portion 16L can define an area in which an n-field effect transistor can be formed, while the second semiconductor material portion 16R can define an area in which a p-field effect transistor can be formed. The first semiconductor material portion 16L and the second semiconductor material portion 16R comprise a same material as the semiconductor material layer 14.

The first semiconductor material portion 16L and the second semiconductor material portion 16R can be formed by patterning the semiconductor material layer 14 by lithography and etching. Lithography can include forming a photoresist (not shown) on an upper surface of the semiconductor material layer 14, exposing the photoresist to a desired pattern of radiation and developing the photoresist utilizing a resist developer. The etching used in forming the first semiconductor material portion 16L and the second semiconductor material portion 16R may include dry etching (i.e., reactive ion etching, plasma etching, ion beam etching or laser ablation) and/or a chemical wet etch process. In one example, HF can be used as a chemical etchant to remove portions of the semiconductor material layer 14 that are not protected by a patterned photoresist material. After etching, the patterned photoresist material can be removed utilizing a stripping process such as, for example, ashing.

The etching provides trenches located adjacent to the first semiconductor material portion 16L and the semiconductor material portion 16R which may expose an upper surface of an underlying material. In the embodiment illustrated in the drawings, each trench will expose a portion of an upper surface of the underlying insulator layer 12. In other embodiments and when a bulk substrate is used (not shown), each trench will expose a portion of the semiconductor material that constitutes the bulk semiconductor substrate.

In some embodiments, the trenches may remain unfilled. In other embodiments, and as illustrated in FIG. 2, each of the trenches may be filled with a trench dielectric material such as, for example, an oxide. Optionally, a liner may be formed in each trench prior to trench fill, a densification step may be performed after the trench fill and a planarization process may follow the trench fill as well. Each isolation trench 18 that is formed has an upper surface that is coplanar with an upper surface of the first semiconductor material portion 16L and an upper surface of the second semiconductor material portion 16L. Sidewall edges of some of the trench isolation region 18 directly contact sidewall edges of the first semiconductor material portion 16L and sidewall edges of the second semiconductor material portion 16L.

Figure 3:
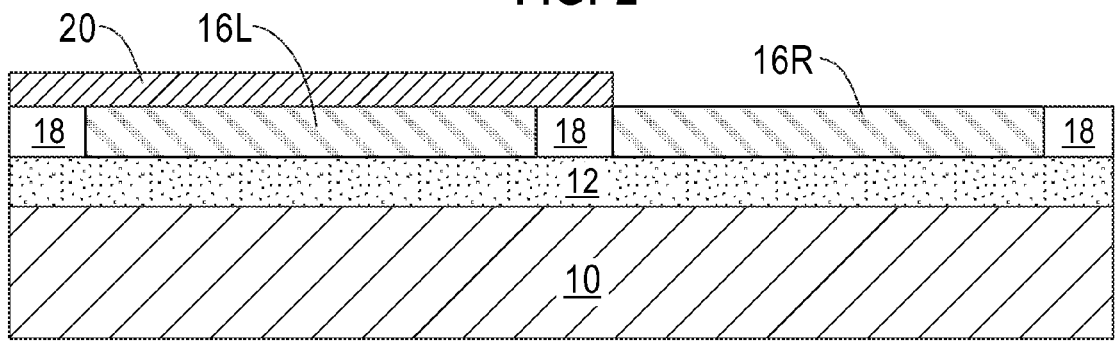
FIG. 3 is a cross sectional view of the first exemplary semiconductor structure of FIG. 2 after forming an oxygen impermeable hard mask on the first semiconductor material portion, but not the second semiconductor material portion.

Referring now to FIG. 3, there is illustrated the first exemplary semiconductor structure of FIG. 2 after forming an oxygen impermeable hard mask 20 on the first semiconductor material portion 16L, but not the second semiconductor material portion 16R. The term "oxygen impermeable" denotes any material in which oxygen does not readily diffuse therethrough. Notably, an "oxygen impermeable" material refers to a material having an oxygen diffusion rate that does not exceed 50% of the oxygen diffusion rate in silicon oxide formed by thermal oxidation. In one embodiment, the "oxygen impermeable material" has an oxygen diffusion rate that does not exceed 10% of the oxygen diffusion rate in silicon oxide formed by thermal oxidation. In one embodiment of the present application, the oxygen impermeable hard mask 20 may comprise a dielectric nitride such as, for example, silicon nitride. In other embodiment of the present application, the oxygen impermeable hard mask 20 may comprise tantalum nitride.

The oxygen impermeable hard mask 20 can be formed by first applying a blanket layer of an oxygen impermeable hard mask material to the surface of the structure shown in FIG. 2. The oxygen impermeable hard mask material used in providing the oxygen impermeable hard mask 20 can be formed utilizing a deposition process including, for example, chemical vapor deposition (CVD), plasma enhanced chemical vapor deposition (PECVD), chemical solution deposition, evaporation, or physical vapor deposition (PVD). Alternatively, the oxygen impermeable hard mask material can be formed by a thermal nitridation process. In one embodiment, the oxygen impermeable hard mask material that is formed has a thickness from 5 nm to 100 nm. Other thicknesses that are greater than or lesser than the aforementioned thickness range can also be used for the thickness of the oxygen impermeable hard mask material. After forming the oxygen impermeable hard mask material, the oxygen impermeable hard mask material is subjected to patterning. That is, lithography and etching can be used in providing the oxygen impermeable hard mask 20.

Figure 4:
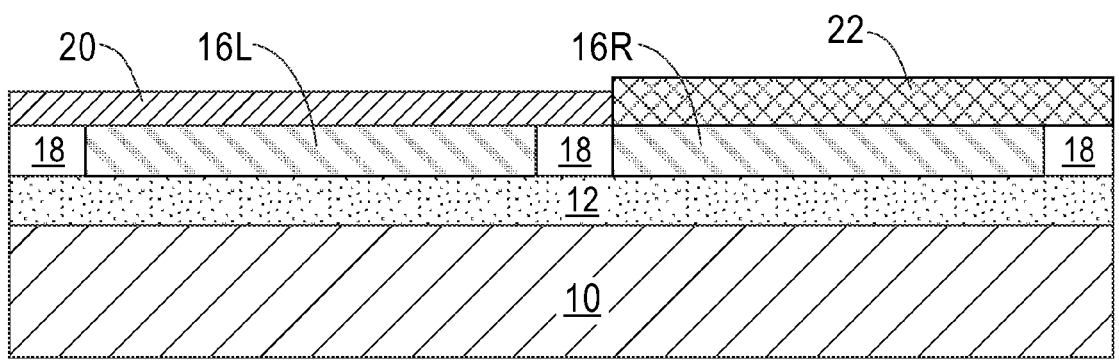
FIG. 4 is a cross sectional view of the first exemplary semiconductor structure of FIG. 3 after forming an epitaxial SiGe layer directly on an exposed surface of the second semiconductor material portion.

Referring now to FIG. 4, there is illustrated the first exemplary semiconductor structure of FIG. 3 after forming an epitaxial SiGe (i.e., silicon germanium) layer 22 directly on an exposed surface of the second semiconductor material portion 16R; no SiGe is formed in contact with the first semiconductor material portion 16L.

The epitaxial SiGe layer 22 that is formed on the upper surface of the second semiconductor material portion 16R has an epitaxial relationship with the upper surface of the second semiconductor material portion 16R. That is, epitaxial SiGe layer 22 has a same crystallographic orientation as that of the upper surface of the second semiconductor material portion 16R. Typically, and as shown in FIG. 4, the epitaxial SiGe layer 22 has vertical edges that are vertically coincident, i.e., aligned, to vertical edges of the second semiconductor material portion 16R.

The epitaxial SiGe layer 22 can be formed utilizing any epitaxial growth (or deposition) process. The terms "epitaxial growth and/or deposition" and "epitaxially formed and/or grown" mean the growth of a semiconductor material on a deposition surface of a semiconductor material, in which the semiconductor material being grown has the same crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on semiconductor surface, and do not deposit material on dielectric surfaces, such as silicon dioxide or silicon nitride surfaces.

Examples of various epitaxial growth process apparatuses that are suitable for use in forming the epitaxial SiGe layer 22 of the present application include, e.g., rapid thermal chemical vapor deposition (RTCVD), low-energy plasma deposition (LEPD), ultra-high vacuum chemical vapor deposition (UHVCVD), atmospheric pressure chemical vapor deposition (APCVD) and molecular beam epitaxy (MBE). The temperature for epitaxial deposition process for forming the epitaxial SiGe layer 22 typically ranges from 550° C. to 900° C. Although higher temperature typically results in faster deposition, the faster deposition may result in crystal defects and film cracking.

A number of different source gases may be used for the deposition of the epitaxial SiGe layer 22. In one embodiment, a combination of a silicon source gas and a germanium source gas can be used in forming the layer of silicon germanium alloy. Examples of silicon source gases that can be used include silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. Examples of germanium source gases that can be used include germane, digermane, halogermane, dichlorogermane, trichlorogermane, tetrachlorogermane and combinations thereof. In some embodiments, a single source gas that includes a silicon component and a germanium component may be used in forming the epitaxial SiGe layer 22. Carrier gases like hydrogen, nitrogen, helium and argon can be used during the epitaxial growth process.

In some embodiments of the present application, the upper surface of the epitaxial SiGe layer 22 is coplanar with the upper surface of the oxygen impermeable hard mask 20. In other embodiments of the present application, the upper surface of the epitaxial SiGe layer 22 is vertically offset, i.e., located either above or below, the upper surface of the oxygen impermeable hard mask 20.

In one embodiment of the present application, the epitaxial SiGe layer 22 that is formed has a thickness from 3 nm to 100 nm. Other thicknesses that are below and/or above the aforementioned thickness range can also be used as the thickness of the epitaxial SiGe layer 22.

In one embodiment of the present application, the epitaxial SiGe layer 22 that is employed in the present application contains from 20 atomic percent to 80 atomic percent of germanium, and the reminder is comprised of silicon. In another embodiment of the present application, the epitaxial SiGe layer 22 that is employed in the present application contains from 40 atomic percent to 60 atomic percent of germanium, and the reminder is comprised of silicon.

Figure 5:
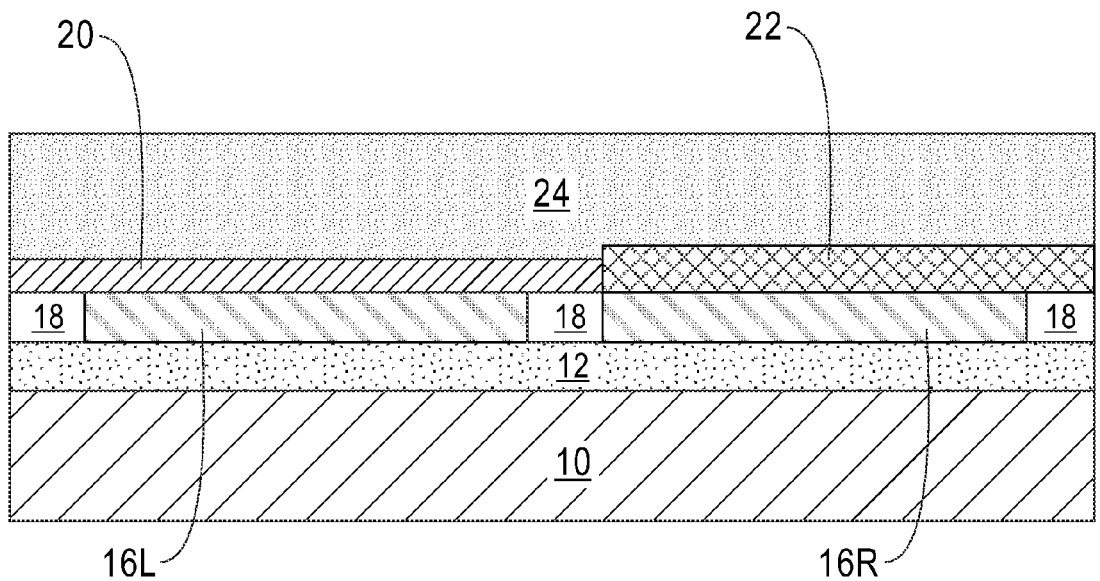
FIG. 5 is a cross sectional view of the first exemplary semiconductor structure of FIG. 4 after forming an oxygen permeable hard mask.

Referring now to FIG. 5, there is illustrated the first exemplary semiconductor structure of FIG. 4 after forming an oxygen permeable hard mask 24. The oxygen permeable hard mask 24 that is formed is a contiguously layer that covers the entirety of the structure shown in FIG. 4. Notably, the oxygen permeable hard mask 24 covers the oxygen impermeable hard mask 20 and the epitaxial SiGe layer 22. In some embodiments, the oxygen permeable hard mask 24 has an upper surface that in entirely planar.

The term "oxygen permeable hard mask" is used throughout the present application to denote any material that readily permits oxygen to diffusion therethrough. Notably, an "oxygen permeable" material refers to a material having an oxygen diffusion rate that exceeds 50% of the oxygen diffusion rate in silicon oxide formed by thermal oxidation. In one embodiment, an "oxygen permeable" material has an oxygen diffusion rate that exceeds 100% of the oxygen diffusion rate in silicon oxide formed by thermal oxidation. In one embodiment of the present application, the oxygen permeable hard mask 24 may comprise a dielectric oxide such as, for example, silicon oxide. In other embodiment of the present application, the oxygen permeable hard mask 23 may comprise carbon or a fluoride doped silicon oxide. In other embodiments, the oxygen permeable hardmask 23 may comprise a low-k material, i.e., (SiCOH). By "low-k" it is meant a material having a dielectric constant less than the dielectric constant of silicon oxide.

The oxygen permeable hard mask 24 can be formed by applying a blanket layer of an oxygen permeable capping material to the surface of the structure shown in FIG. 4. The oxygen permeable capping material used in providing the oxygen permeable hard mask 24 can be formed utilizing a deposition process including, for example, chemical vapor deposition (CVD), plasma enhanced chemical vapor deposition (PECVD), chemical solution deposition, evaporation, physical vapor deposition (PVD), spin-on technique, or any suitable combination of these techniques. In one example, an oxygen permeable hard mask 24 comprising silicon oxide can be formed by chemical vapor deposition at a deposition temperature of from 200° C. to 500° C. In another example, an oxygen permeable hardmask 24 comprises silicon oxide formed by spin-on technique.

In one embodiment, the oxygen permeable hard mask 24 that is formed has a thickness from 2 nm to 10 nm. Other thicknesses that are greater than or lesser than the aforementioned thickness range can also be used for the thickness of the oxygen permeable hard mask 24.

Figure 6:
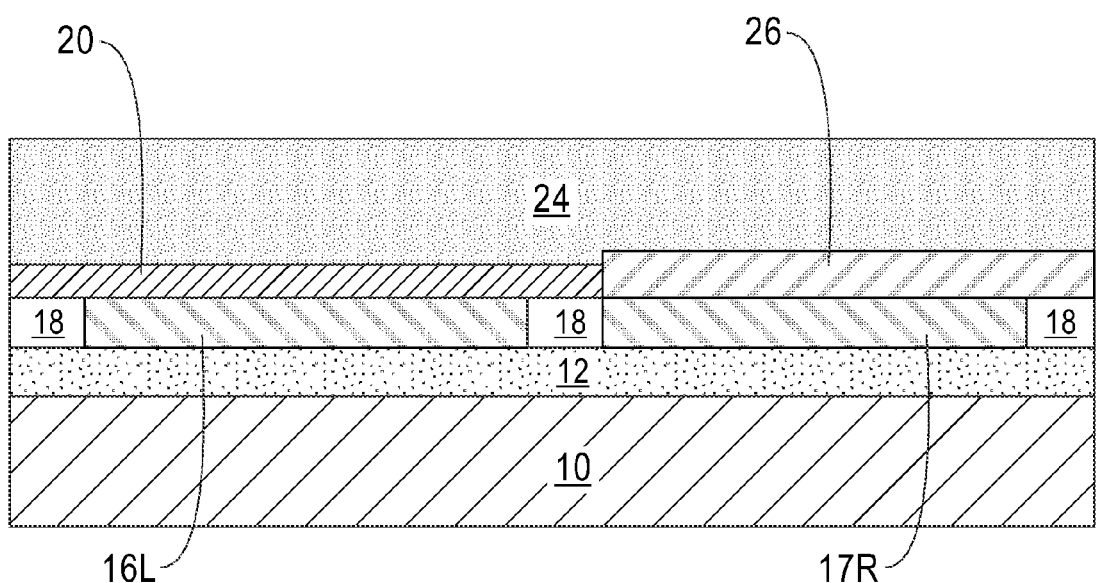
FIG. 6 is a cross sectional view of the first exemplary semiconductor structure of FIG. 5 after performing thermal condensation which converts the epitaxial SiGe layer into a silicon oxide layer and converts the second semiconductor material portion into a germanium-containing semiconductor material portion.

Referring now to FIG. 6, there is illustrated the first exemplary semiconductor structure of FIG. 5 after performing thermal condensation, i.e., thermal oxidation in which germanium from the epitaxial SiGe layer 22 is driven out of the epitaxial SiGe layer and into the second semiconductor portion 16R. Since an oxygen impermeable hard mask 20 is present on the first semiconductor material portion 16L, the first semiconductor material portion 16L remains unchanged. However, and since an oxygen permeable hard mask 24 is the only material present atop the epitaxial SiGe layer 22, the thermal condensation process converts the epitaxial SiGe layer 22 into a silicon oxide layer 26 and converts the second semiconductor material portion 16R into a germanium-containing semiconductor material portion 17R. It is noted that the presence of the oxygen permeable hard mask 24 atop the epitaxial SiGe layer 22 prevents agglomeration of the first semiconductor material portion 16L and the epitaxial SiGe layer and the second semiconductor portion 16R during the thermal condensation process.

By "germanium-containing semiconductor material portion" it is meant a semiconductor material in which germanium is present. In some embodiments, the diffusion of germanium from the epitaxial SiGe layer 22 into the second semiconductor material portion 16R provides the only source of germanium being introduced into the second semiconductor material portion 16R. Thus, and by way of an example, when the second semiconductor material portion 16R comprises silicon, the thermal condensation process of the present application converts the second semiconductor material portion 16R into a SiGe material portion 17L. In some embodiments, the diffusion of germanium from the epitaxial SiGe layer 22 into the second semiconductor material portion 16R provides an added germanium content to the second semiconductor material portion 16R. In one example, and when the second semiconductor material portion 16R comprises silicon germanium, the thermal condensation process of the present application converts the second semiconductor material portion 16R into a SiGe material portion 17L. In this embodiment, the SiGe material portion 17L that is formed has a higher content of germanium than the original silicon germanium second semiconductor material portion 16R.

The thermal condensation of the present application is a thermal oxidation process that is performed at temperature sufficient enough to cause diffusion of germanium out of the epitaxial SiGe layer 22 and into the second semiconductor material portion 16R. In one embodiment of the present application, the thermal condensation is performed at a temperature from 700° C. to 1300° C. In another embodiment of the present application, the thermal condensation is performed at a temperature from 1000° C. to 1200° C.

Moreover, the thermal condensation of the present application is performed in an oxidizing ambient which includes at least one oxygen-containing gas such as $O_2$, NO, $N_2O$, ozone, air and other like oxygen-containing gases. The oxygen-containing gas may be admixed with each other (such as an admixture of $O_2$ and NO), or the gas may be diluted with an inert gas such as He, Ar, $N_2$, Xe, Kr, or Ne.

The thermal condensation process of the present application may be carried out for a variable period of time. In one example, the thermal condensation process is carried out for a time period from 5 seconds to about 5 hours, depending on thermal oxidation temperature and oxidation species. In another embodiment, the thermal condensation process may be carried out for a time period from 5 minutes to about 30 minutes. The thermal condensation process of the present application may be carried out at a single targeted temperature, or various ramp and soak cycles using various ramp rates and soak times can be employed.

In some embodiments, the germanium-containing semiconductor material portion 17R that is formed by the thermal condensation process of the present application may have a thickness that is the same as the thickness of the second semiconductor material portion 16R. In other embodiments of the present application, the germanium-containing semiconductor material portion 17R that is formed by the thermal condensation process of the present application may have a thickness that is greater than or lesser than the thickness of the second semiconductor material portion 16R.

In some embodiments, the silicon oxide layer 26 that is formed by the thermal condensation process of the present application may have a thickness that is the same as the thickness of the epitaxial SiGe layer 22. In other embodiments of the present application, the silicon oxide layer 26 that is formed by the thermal condensation process of the present application may have a thickness that is greater than or lesser than the thickness of the epitaxial SiGe layer 22.

Figure 7:
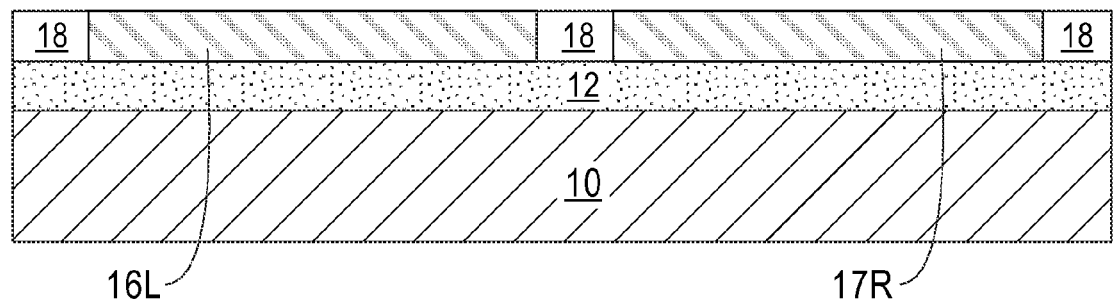
FIG. 7 is a cross sectional view of the first exemplary semiconductor structure of FIG. 6 after removing the oxygen permeable hard mask, the oxygen impermeable hard mask and the silicon oxide layer from the structure.

Referring now to FIG. 7, there is illustrated the first exemplary semiconductor structure of FIG. 6 after removing the oxygen permeable hard mask 24, the oxygen impermeable hard mask 20 and the silicon oxide layer 26 from the structure. After removing the oxygen permeable hard mask 24, the oxygen impermeable hard mask 20 and the silicon oxide layer 26 from the structure, an upper surface of the first semiconductor material portion 16L and an upper surface of the germanium-containing semiconductor material portion 17R are exposed.

The removal of the oxygen permeable hard mask 24, the oxygen impermeable hard mask 20 and the silicon oxide layer 26 from the structure may be performed by a planarization process such as, for example, chemical mechanical planarization and/or grinding. Alternatively, various chemical etching process can be used to remove the oxygen permeable hard mask 24, the oxygen impermeable hard mask 20 and the silicon oxide layer 26 from the structure.

Figure 8:
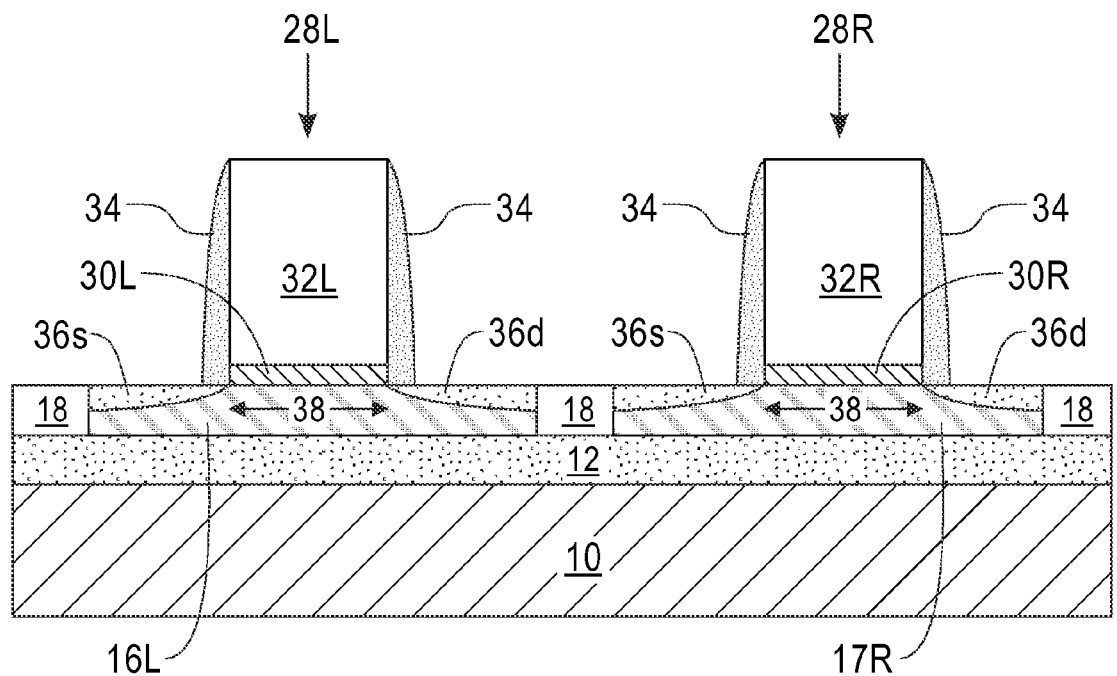
FIG. 8 is a cross sectional view of the first exemplary semiconductor structure of FIG. 7 after forming a first functional gate structure on the first semiconductor material portion and a second functional gate structure on the germanium-containing semiconductor material portion in accordance with an embodiment of the present application.

Referring now to FIG. 8, there is illustrated the first exemplary semiconductor structure of FIG. 7 after forming a first functional gate structure 28L on the first semiconductor material portion 16L and a second functional gate structure 28R on the germanium-containing semiconductor material portion 17R. In some embodiments of the present application, the first functional gate structure 28L is an nFET, while the second functional gate structure 28R is a pFET. In such an embodiment, enhanced performance of the second functional gate structure 28R is achieved in the present application since the second functional gate structure 28R is formed on the germanium-containing semiconductor material portion 17R.

The term "functional gate structure" is used throughout the present application as a permanent gate structure used to control output current (i.e., flow of carriers in the channel) of a semiconducting device through electrical or magnetic fields. In some embodiments (not shown), a sacrificial gate structure can be formed instead of at least one of the functional gate structures 28L, 28R. In embodiments in which one functional gate structure and one sacrificial gate structure are formed, block mask technology can be used in forming the different gate structures. When a sacrificial gate structure is employed, the sacrificial gate structure can be replaced with a functional gate structure any time after the source and drain regions have been defined within the first semiconductor material portion and/or germanium-containing semiconductor portion. Such an embodiment will be described in greater detail herein below and in reference to FIGS. 9-13 of the present application.

In the embodiment illustrated in FIG. 8, each gate structure is a functional gate structure 28L, 28R that includes a gate dielectric material portion 30L, 30R and a gate conductor material portion 32L, 32L. In some embodiments of the present application, the functional gate structure 28L has a different conductivity than the functional gate structure 28R. For example, the functional gate structure 28L may be an nFET, while the functional gate structure 28R may be a pFET. The functional gate structures 28L, 28R can be formed by first providing a material stack of a gate dielectric material, and a gate conductor material. This material stack is then patterned by lithography and etching.

The gate dielectric material that provides the gate dielectric material portion 30L, 30R of each functional gate structure 28L, 28R can be an oxide, nitride, and/or oxynitride. In one example, the gate dielectric material that provides the gate dielectric material portion 30L, 30R of each functional gate structure 28L, 28R can be a high-k material having a dielectric constant greater than silicon dioxide. Exemplary high-k dielectrics include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, SiON, $SiN_x$, a silicate thereof, and an alloy thereof. Each value of x is independently from 0.5 to 3 and each value of y is independently from 0 to 2. In some embodiments, a multilayered gate dielectric structure comprising different gate dielectric materials, e.g., silicon dioxide, and a high-k gate dielectric can be formed.

In some embodiments, the gate dielectric material portion 30L of the first functional gate structure 28L comprises a same gate dielectric material as the gate dielectric material portion 30R of the second functional gate structure 28R. In other embodiments, the gate dielectric material portion 30L of the first functional gate structure 28L comprises a different gate dielectric material as the gate dielectric material portion 30R of the second functional gate structure 28R.

The gate dielectric material used in providing the gate dielectric material portions 30L, 30R can be formed by any deposition technique including, for example, chemical vapor deposition (CVD), plasma enhanced chemical vapor deposition (PECVD), physical vapor deposition (PVD), sputtering, or atomic layer deposition. When a different gate dielectric material is used for the gate dielectric material portions, block mask technology can be used. In one embodiment of the present application, the gate dielectric material used in providing the gate dielectric material portions 30L, 30R can have a thickness in a range from 1 nm to 10 nm. Other thicknesses that are lesser than or greater than the aforementioned thickness range can also be employed for the gate dielectric material.

Each gate conductor portion 32L, 32R comprises a gate conductor material. In some embodiments, the gate conductor portion 32L of the first functional gate structure 28L comprises a same gate conductor material as the gate conductor portion 32R of the second functional gate structure 28R. In other embodiments, the gate conductor portion 32L of the first functional gate structure 28L comprises a different gate conductor material as the gate conductor portion 32R of the second functional gate structure 28R.

The gate conductor material used in providing the gate conductor material portions 32L, 32R can include any conductive material including, for example, doped polysilicon, an elemental metal (e.g., tungsten, titanium, tantalum, aluminum, nickel, ruthenium, palladium and platinum), an alloy of at least two elemental metals, an elemental metal nitride (e.g., tungsten nitride, aluminum nitride, and titanium nitride), an elemental metal silicide (e.g., tungsten silicide, nickel silicide, and titanium silicide) or multilayered combinations thereof.

In some embodiments, the gate conductor material portion 32L may comprise an nFET gate metal, while the gate conductor material portion 32R may comprise a pFET gate metal.

The gate conductor material used in providing the gate conductor material portions 32L, 32R can be formed utilizing a deposition process including, for example, chemical vapor deposition (CVD), plasma enhanced chemical vapor deposition (PECVD), physical vapor deposition (PVD), sputtering, atomic layer deposition (ALD) or other like deposition processes. When a metal silicide is formed, a conventional silicidation process is employed. When a different gate conductor material is used for the gate conductor portions, block mask technology can be used. In one embodiment, the gate conductor material used in providing the gate conductor material portions 32L, 32R of each functional gate structure 28L, 28R has a thickness from 1 nm to 100 nm. Other thicknesses that are lesser than or greater than the aforementioned thickness range can also be employed for the gate conductor material.

After forming each functional gate structure 28L, 28R and as also shown in FIG. 8, a spacer 34 can be formed on each vertical sidewall of each functional gate structure 28L, 28R and thereafter a source region 36s and a drain region 36d can be formed into the first semiconductor material portion 16L and the germanium-containing semiconductor portion 17R. Each source region 36s is formed on one side of each functional gate structure 28L, 28R, while each drain region 36d is formed on another side of each functional gate structure 28L, 28R. The semiconductor material of the first semiconductor material portion 16L and the germanium-containing semiconductor portion 17 that is located beneath each functional gate structure 28L, 28R and positioned between the source region 36s and the drain region 36d is referred as a channel region 38.

The spacer 34 can be formed by first providing a spacer material and then etching the spacer material. The spacer material may be composed of any dielectric spacer material including, for example, a dielectric oxide, dielectric nitride, and/or dielectric oxynitride. In one example, the spacer material used in providing the spacer 34 may be composed of silicon dioxide or silicon nitride. The spacer material can be provided by a deposition process including, for example, chemical vapor deposition (CVD), plasma enhanced chemical vapor deposition (PECVD), or physical vapor deposition (PVD). The etching of the spacer material may comprise a dry etch process such as, for example, a reactive ion etch.

In some embodiments, a source extension region and drain extension region (not separately shown) are typically formed prior to forming the spacer 34 utilizing an extension ion implantation process. As such, a portion of each of the source extension region and drain extension region would be located beneath the spacer 34 and within the first semiconductor material portion 16L and the germanium-containing semiconductor material portion 17R. After forming the spacer 20, source region 36s and drain region 36d are formed utilizing a source/drain ion implantation process. An activation anneal may follow the implantation processes.

Each source region 36s (including the corresponding source extension region) and each drain region 36d (including the corresponding drain extension region) may be doped with a p-type or n-type dopant. The term "p-type" refers to the addition of impurities to an intrinsic semiconductor that creates deficiencies of valence electrons. Examples of p-type dopants, i.e., impurities, include, but are not limited to, boron, aluminum, gallium and indium. "N-type" refers to the addition of impurities that contributes free electrons to an intrinsic semiconductor. Examples of n-type dopants, i.e., impurities, include, but are not limited to, antimony, arsenic and phosphorous. The concentration of dopants within the source region 36s (and corresponding source extension region) and the drain region 36d (and the corresponding drain extension region) can be within ranges typically used in forming metal oxide semiconductor field effect transistors (MOSFETs).

Figure 9:
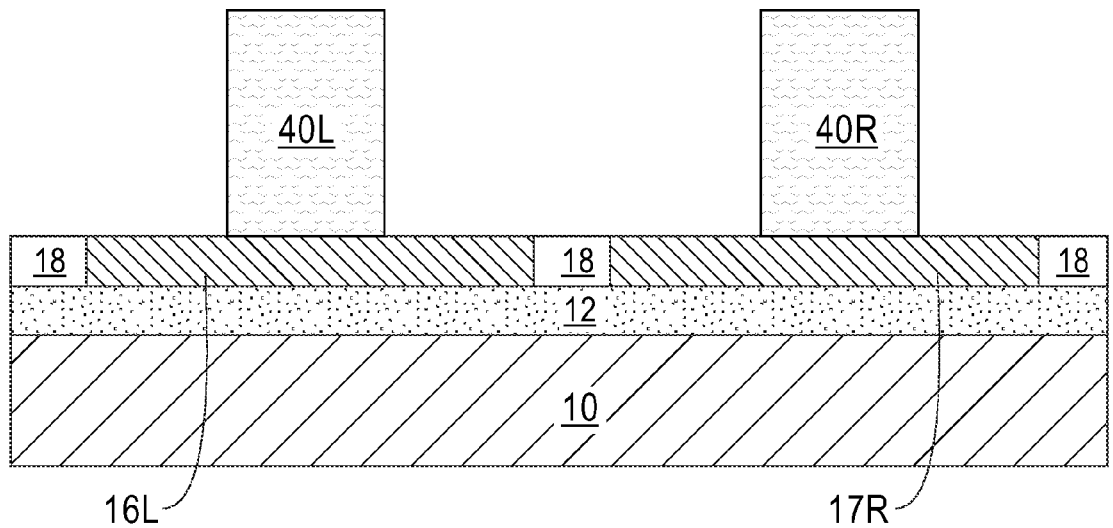
FIG. 9 is a cross sectional view of the first exemplary semiconductor structure of FIG. 7 after forming a first sacrificial gate structure on the first semiconductor material portion and a second sacrificial gate structure on the germanium-containing semiconductor material portion in accordance with another embodiment of the present application.

Referring now to FIG. 9, there is illustrated the first exemplary semiconductor structure of FIG. 7 after forming a first sacrificial gate structure 40L on the first semiconductor material portion 16L and a second sacrificial gate structure 40R on the germanium-containing semiconductor material portion 17R in accordance with another embodiment of the present application. The term "sacrificial gate structure" is used throughout the present application to denote a material that serves as a placeholder structure for a functional gate structure to be subsequently formed. Although the embodiment that is illustrated and described herein below contains a sacrificial gate structure on each of the first semiconductor material portion 16L and the germanium-containing semiconductor material portion 17R, it is possible to form a sacrificial gate structure on one of the first semiconductor material portion 16L or the germanium-containing semiconductor material portion 17R, and form a functional gate structure on the other of the first semiconductor material portion 16L or the germanium-containing semiconductor material portion 17R not including the sacrificial gate structure. In such an embodiment, block mask technology may be used to form the different gate structures.

In embodiments in which sacrificial gate structures are formed, the sacrificial gate structure 40L, 40R can be formed by first providing a blanket layer of a sacrificial gate material. The blanket layer of sacrificial gate material can be formed, for example, by chemical vapor deposition or plasma enhanced chemical vapor deposition. The thickness of the blanket layer of sacrificial gate material can be from 50 nm to 300 nm, although lesser and greater thicknesses can also be employed. The blanket layer of sacrificial gate material can include any material that can be selectively removed from the structure during a subsequently performed etching process. In one embodiment, the blanket layer of sacrificial gate material may be composed of polysilicon. In another embodiment of the present application, the blanket layer of sacrificial gate material may be composed of a metal such as, for example, Al, W, or Cu. After providing the blanket layer of sacrificial gate material, the blanket layer of sacrificial gate material can be patterned by lithography and etching so as to form the sacrificial gate structure.

Figure 10:
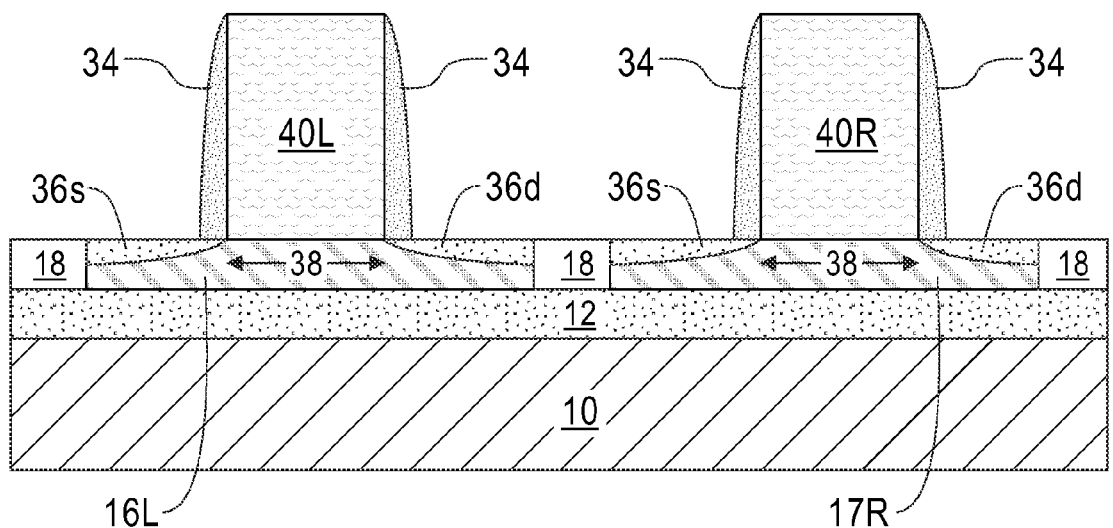
FIG. 10 is a cross sectional view of the first exemplary semiconductor structure of FIG. 9 after forming a spacer on sidewalls of the first sacrificial gate structure, and the second sacrificial gate structure.

Referring now to FIG. 10, there is illustrated the first exemplary semiconductor structure of FIG. 9 after forming a spacer 34 on sidewalls of the first sacrificial gate structure 40L, and the second sacrificial gate structure 40R. The spacer 34 can contain one of the dielectric spacer materials mentioned above and it can be formed utilizing the processing as also mentioned above. Prior to forming the spacers 34, source/drain extension regions (not shown) can be formed into each of the first semiconductor material portion 16L and the germanium-containing semiconductor material portion 17R by ion implantation utilizing each sacrificial gate structure 40L, 40R as ion implantation mask. After forming the spacer 34, source regions 36s and drain regions 36d can be formed into each of the first semiconductor material portion 16L and the germanium-containing semiconductor material portion 17R by ion implantation utilizing each sacrificial gate structure 40L, 40R and spacer 34 as ion implantation mask. The semiconductor material of the first semiconductor material portion 16L and the germanium-containing semiconductor portion 17 that is located beneath each sacrificial gate structure 40L, 40R and positioned between the source region 36s and the drain region 36d is referred as a channel region 38.

Figure 11:
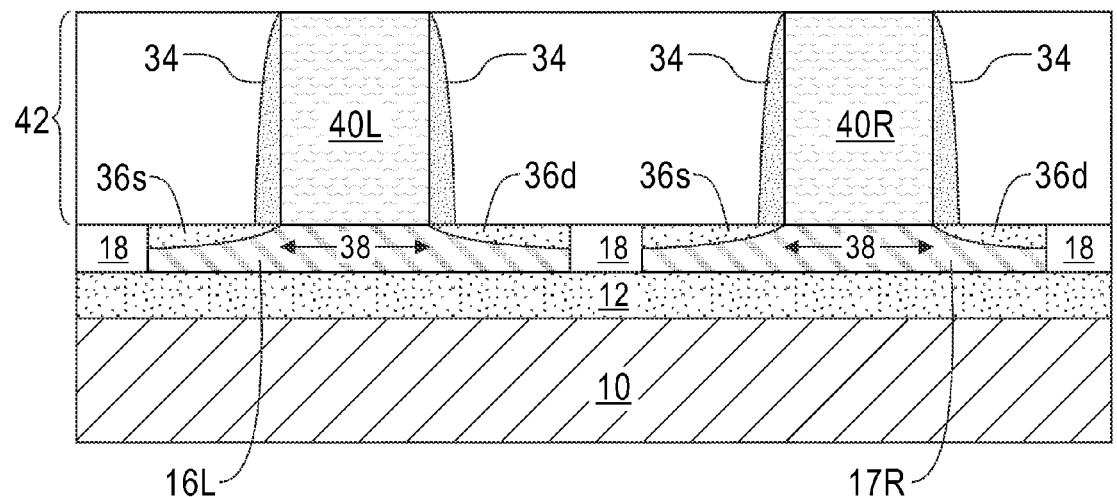
FIG. 11 is a cross sectional view of the first exemplary semiconductor structure of FIG. 10 after forming a dielectric material having an upper surface that is coplanar with an upper surface of the first and second sacrificial gate structures.

Referring now to FIG. 11, there is illustrated the first exemplary semiconductor structure of FIG. 10 after forming a dielectric material 42 having an upper surface that is coplanar with an upper surface of the first and second sacrificial gate structures 40L, 40R. As such, the upper surface of each gate structure, i.e., the first and second sacrificial gate structures 40L, 40R is exposed after forming the dielectric material 42.

In some embodiments, the dielectric material 42 may be composed of, for example, silicon dioxide, undoped silicate glass (USG), fluorosilicate glass (FSG), borophosphosilicate glass (BPSG), a spin-on low-k dielectric layer, a chemical vapor deposition (CVD) low-k dielectric layer or any combination thereof. The term "low-k" as used throughout the present application denotes a dielectric material that has a dielectric constant of less than silicon dioxide. In another embodiment, a self-planarizing material such as a spin-on glass (SOG) or a spin-on low-k dielectric material such as SiLK™ can be used as the dielectric material 42. The use of a self-planarizing dielectric material as dielectric material 42 may avoid the need to perform a subsequent planarizing step.

In one embodiment, the dielectric material 42 can be formed utilizing a deposition process including, for example, chemical vapor deposition (CVD), plasma enhanced chemical vapor deposition (PECVD), evaporation or spin-on coating. In some embodiments, particularly when non-self-planarizing dielectric materials are used as dielectric material 42, a planarization process or an etch back process follows the deposition of the dielectric material. The thickness of the dielectric material 42 that can be employed in the present application may vary depending on the type of dielectric material employed as well as the method that was employed in forming the same. In one embodiment, the dielectric material 42 has a thickness from 80 nm to 500 nm. Other thicknesses that are greater or lesser than the range provided above can also be used for the dielectric material 42.

Figure 12:
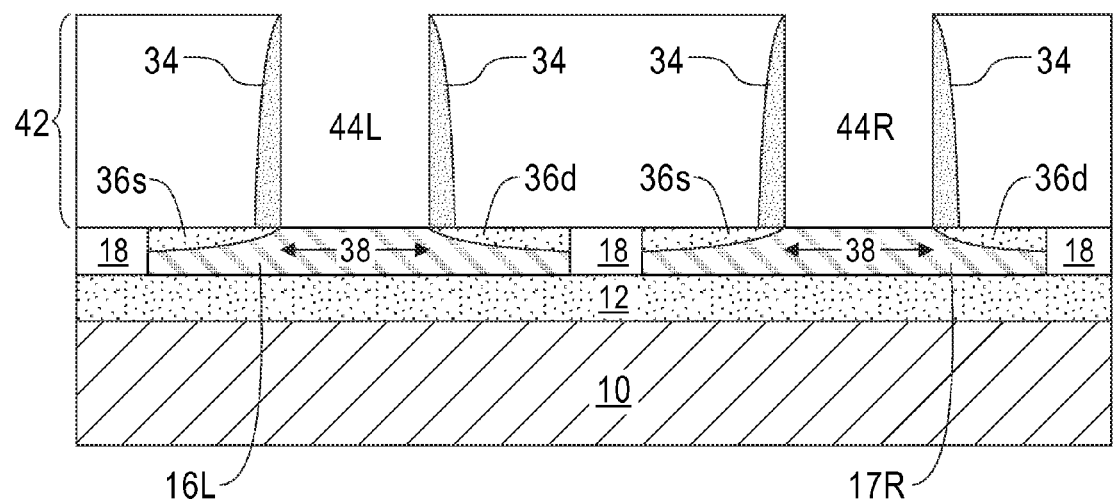
FIG. 12 is a cross sectional view of the first exemplary semiconductor structure of FIG. 11 after removing the first sacrificial gate structure providing a first gate cavity in the area previously occupied by the first sacrificial gate structure and removing the second sacrificial gate structure providing a second gate cavity in the area previously occupied by the second sacrificial gate structure.

Referring now to FIG. 12, there is illustrated the first exemplary semiconductor structure of FIG. 11 after removing the first sacrificial gate structure 40L providing a first gate cavity 44L in the area previously occupied by the first sacrificial gate structure 40L and removing the second sacrificial gate structure 40R providing a second gate cavity 44R in the area previously occupied by the second sacrificial gate structure 40R. In accordance with the present application, each first gate cavity 44L that is formed exposes a surface of the underlying first semiconductor portion 16L, while each second gate cavity 44R that is formed exposed a surface of the underlying germanium-containing semiconductor portion 17R.

Each gate cavity 44L, 44R can be formed by removing each of the sacrificial gate material structures 40L, 40R from the structure. Each sacrificial gate material structure 40L, 40R can be removed by etching. In one example, a reactive ion etch can be used to removal each sacrificial gate material structure 40L, 40R.

Figure 13:
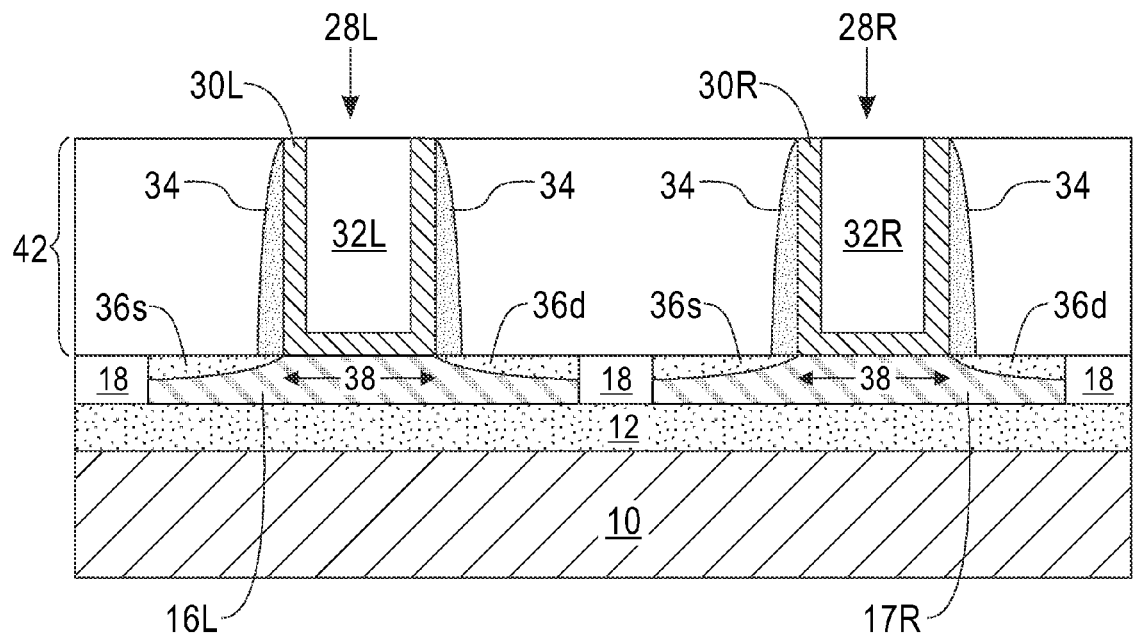
FIG. 13 is a cross sectional view of the first exemplary semiconductor structure of FIG. 12 after forming a first functional gate structure in the first gate cavity and a second functional gate structure in the second gate cavity.

Referring now to FIG. 13, there is illustrated the first exemplary semiconductor structure of FIG. 12 after forming a first functional gate structure 28L in the first gate cavity 44L and on a portion of the first semiconductor portion 16 and a second functional gate structure 28R in the second gate cavity 44R and on a portion germanium-containing semiconductor material portion 17R.

As in the previous embodiment of the present application, each functional gate structure 28L, 28R includes a gate dielectric portion 30L, 30R and a gate conductor portion 32L, 32R. The gate dielectric portions 30L, 30R include one of the gate dielectric materials mentioned in the previous embodiment of the present application and they can be formed as described above. Also, gate conductor portions 32L, 32R include one of the gate conductor materials mentioned in the previous embodiment of the present application and they can be formed as described above.

In some embodiments and as shown in the drawing, each gate dielectric portion 32L, 32R is U-shaped having a bottommost portion in direct contact with an upper surface of a corresponding semiconductor material portion 16L or 17R and vertical portions that are located on exposed sidewalls of each spacer 34. Within each gate cavity 44L, 44R, the gate dielectric portion 30L, 30R surrounds the gate conductor portion 32L, 32R. In another embodiment (not shown), each gate dielectric portion is not U-shaped and thus lacks the vertical portions mentioned. In such an embodiment, the gate conductor portion that is formed atop the non-U-shaped gate dielectric fills the remaining portion of the gate cavity and has outermost edges that directly contact a sidewall surface of each spacer. In another embodiment (not shown), some of the gate dielectric portion are U-shaped and other are not U-shaped.

Figure 14:
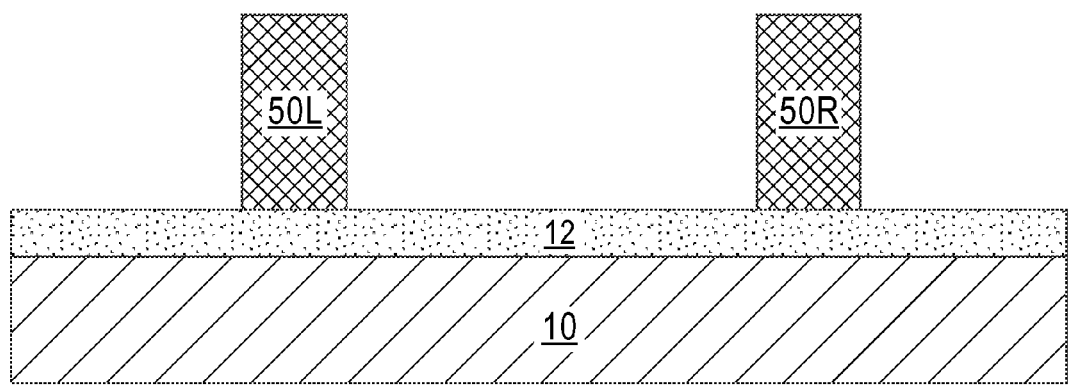
FIG. 14 is a cross sectional view of a second exemplary semiconductor structure including a first semiconductor fin and a second semiconductor fin on a surface of a substrate in accordance with another embodiment of the present application.

Referring now to FIG. 14, there is illustrated a second exemplary semiconductor structure including a first semiconductor fin 50L and a second semiconductor fin 50R on a surface of a substrate in accordance with another embodiment of the present application. Although semiconductor fins are described and illustrated, semiconductor nanowires can be formed in place of the semiconductor fins. The semiconductor fins and semiconductor nanowires can also be referred to herein as semiconductor material portions.

Also, and although a single first semiconductor fin 50L and a single second semiconductor fin 50R are described and illustrated, a plurality of first semiconductor fins and a plurality of second semiconductor fins can be formed. In some embodiments (not shown), a hard mask cap can be present atop each semiconductor 50L, 50R. In such an embodiment, a layer of hard mask material (not shown) such, as for example, silicon dioxide and/or silicon nitride, can be deposited on the exposed surface of the substrate i.e., semiconductor material layer 14, prior to forming each semiconductor fin. During the subsequent formation of the semiconductor fins, a portion of the hard mask provides a fin cap on a topmost surface of each fin. In such a structure, the gate dielectric material portion to be subsequently formed is present only along the vertical sidewalls of each semiconductor fin. In the embodiment that is illustrated, no fin cap is present and as such, the gate dielectric material portion is present along the vertical sidewalls and on a topmost surface of each semiconductor fin.

The first semiconductor fin 50L and the second semiconductor fin 50R can define different semiconductor device regions. For example, the first semiconductor fin 50L can define an area in which an n-FinFET can be formed, while the second semiconductor fin portion 50R can define an area in which a p-FinFET can be formed.

As used herein, a "semiconductor fin" refers to a contiguous structure including a semiconductor material and including a pair of vertical sidewalls that are parallel to each other. As used herein, a surface is "vertical" if there exists a vertical plane from which the surface does not device by more than three times the root mean square roughness of the surface.

In one embodiment of the present application, each semiconductor fin 50L, 50R has a height from 10 nm to 100 nm, and a width from 4 nm to 30 nm. In another embodiment of the present application, each semiconductor fin 50L, 50R has a height from 15 nm to 50 nm, and a width from 5 nm to 12 nm.

The semiconductor structure shown in FIG. 14 can be formed by first providing a semiconductor substrate comprising an upper semiconductor material surface. The semiconductor substrate that can be used in this embodiment may include one of the semiconductor substrates mentioned above. In one example, and as illustrated, the semiconductor substrate used in providing the structure shown in FIG. 14 includes a semiconductor-on-insulator substrate that contains a handle substrate 10, an insulator layer 12 and a semiconductor material layer 14 that has been processed into semiconductor fins.

In the illustrated embodiment of the present application, each semiconductor fin 50L, 50R has a bottommost surface that is located on a surface of the insulator layer 12. Thus, and in the illustrated embodiment, each semiconductor fin 50L, 50R is formed on a surface of a substrate that is provided by insulator layer 12. In such an embodiment, an interface is present between the bottommost surface of each semiconductor fin 50L, 50R and an upper surface of the insulator layer 12. In other embodiments of the present application (not shown), each semiconductor fin 50L, 50R has a bottommost surface that is located on a non-recessed surface of a bulk semiconductor substrate. In such an embodiment, no interface is present between the bottommost surface of each semiconductor fin 50L, 50R and the non-recessed surface of the bulk semiconductor substrate.

In the illustrated embodiment of the present application, each semiconductor fin 50L, 50R that is formed comprises a same semiconductor material as that of the semiconductor material layer 14. Each semiconductor fin 50L, 50R is spaced apart from its nearest neighboring semiconductor fin(s). Also, each semiconductor fin 50L, 50R is oriented parallel to each other.

After providing the semiconductor structure, the semiconductor fins can be formed by lithography and etching. Lithography can include forming a photoresist (not shown) on the topmost surface of the layer of hard mask material (or the topmost surface of the semiconductor substrate i.e., semiconductor material layer 14, when no layer of hard mask material is present), exposing the photoresist to a desired pattern of radiation, and then developing the exposed photoresist with a conventional resist developer to provide a patterned photoresist atop the semiconductor substrate. At least one etch is then employed which transfers the pattern from the patterned photoresist into the semiconductor material portion of the semiconductor substrate. In the illustrated embodiment, at least one etch can be used to transfer the patterned from the patterned photoresist material into the semiconductor material layer 14, utilizing the underlying insulator layer 12 as an etch stop. In one embodiment, the etch used for pattern transfer may include a dry etch process such as, for example, reactive ion etching, plasma etching, ion beam etching or laser ablation. In another embodiment, the etch used for pattern transfer may include a sidewall image transfer (SIT) process. After transferring the pattern into the semiconductor substrate, i.e., semiconductor material layer 14, the patterned photoresist can be removed utilizing a conventional resist stripping process such as, for example, ashing.

Figure 15:
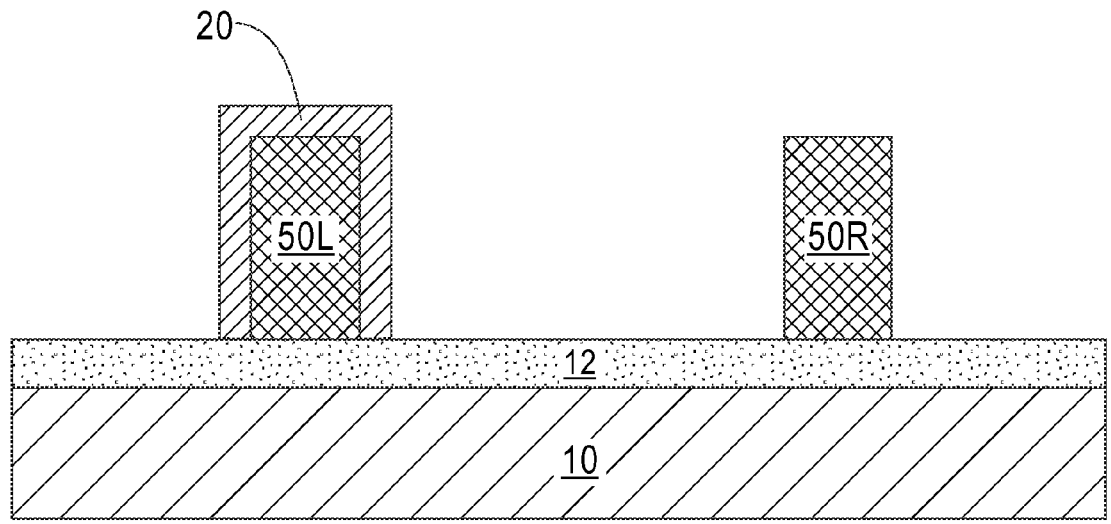
FIG. 15 is a cross sectional view of the second exemplary semiconductor structure of FIG. 14 after forming an oxygen impermeable hard mask straddling the first semiconductor fin, but not the second semiconductor fin.

Referring now to FIG. 15, there is illustrated the second exemplary semiconductor structure of FIG. 14 after forming an oxygen impermeable hard mask 20 straddling the first semiconductor fin 50L, but not the second semiconductor fin 50R. The oxygen impermeable hard mask 20 that can be used in this embodiment of the present application includes one of the oxygen impermeable materials mentioned in the previous embodiment of the present application. Also, the oxygen impermeable hard mask 20 that can be used in this embodiment of the present application can be formed utilizing the technique mentioned in the previous embodiment of the present application in forming the structure shown in FIG. 3 of the present application. As is shown in FIG. 15, the oxygen impermeable hard mask 20 that can be used in this embodiment of the present application is present on sidewall surfaces and atop each first semiconductor fin 50. In some embodiments and as shown in FIG. 15, a surface of the oxygen impermeable hard mask 20 may contact an upper surface of insulator layer 12.

Figure 16:
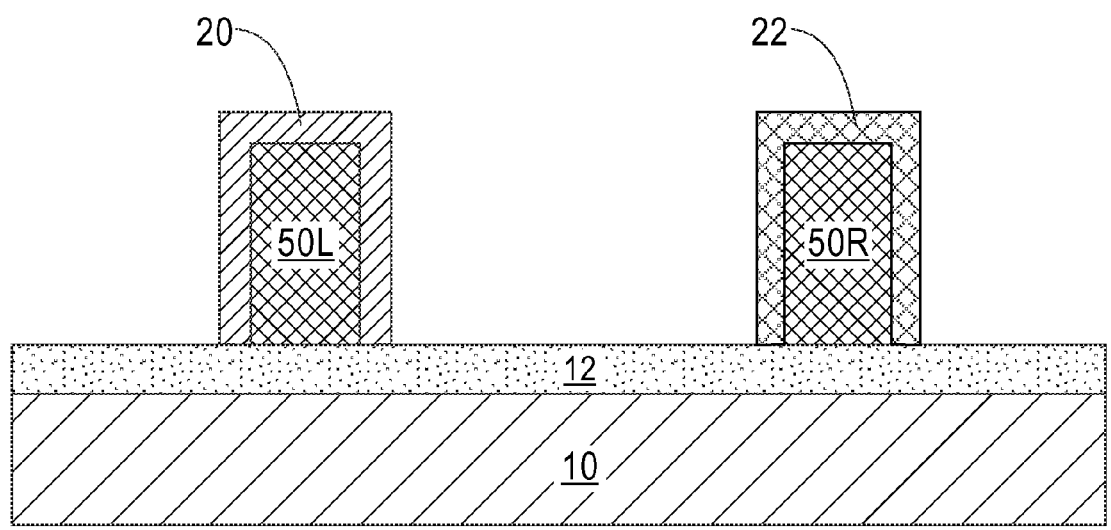
FIG. 16 is a cross sectional view of the second exemplary semiconductor structure of FIG. 15 after forming an epitaxial SiGe layer directly on an exposed surface of the second semiconductor fin.

Referring now to FIG. 16, there is illustrated the second exemplary semiconductor structure of FIG. 15 after forming an epitaxial SiGe layer 22 directly on an exposed surfaces of the second semiconductor fin 50L. The epitaxial SiGe layer 22 that can be used in this embodiment of the present application includes one of the SiGe materials mentioned in the previous embodiment of the present application. Also, the epitaxial SiGe layer 22 that can be used in this embodiment of the present application can be formed utilizing the technique mentioned in the previous embodiment of the present application in forming the structure shown in FIG. 4 of the present application. As is shown in FIG. 16, the epitaxial SiGe layer 22 that can be used in this embodiment of the present application is present on sidewall surfaces and atop each second semiconductor fin 50R. In some embodiments and as shown in FIG. 16, a surface of the epitaxial SiGe layer 22 may contact an upper surface of insulator layer 12.

Figure 17:
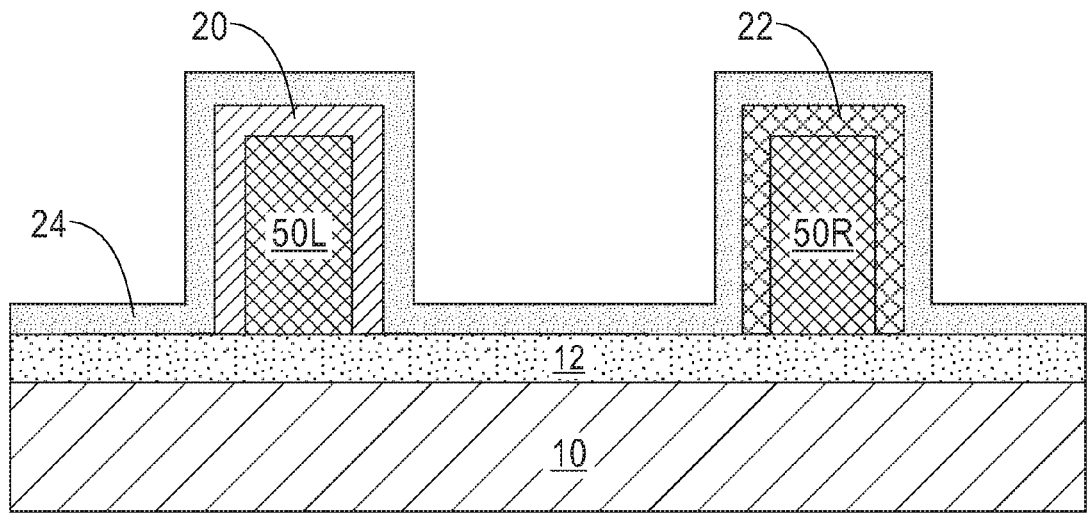
FIG. 17 is a cross sectional view of the second exemplary semiconductor structure of FIG. 16 after forming an oxygen permeable hard mask.

Referring now to FIG. 17, there is illustrated the second exemplary semiconductor structure of FIG. 16 after forming an oxygen permeable hard mask 24. The oxygen permeable hard mask 24 that can be used in this embodiment of the present application includes one of the oxygen permeable capping materials mentioned in the previous embodiment of the present application. Also, the oxygen permeable hard mask 24 that can be used in this embodiment of the present application can be formed utilizing the technique mentioned in the previous embodiment of the present application in forming the structure shown in FIG. 5 of the present application.

Figure 18:
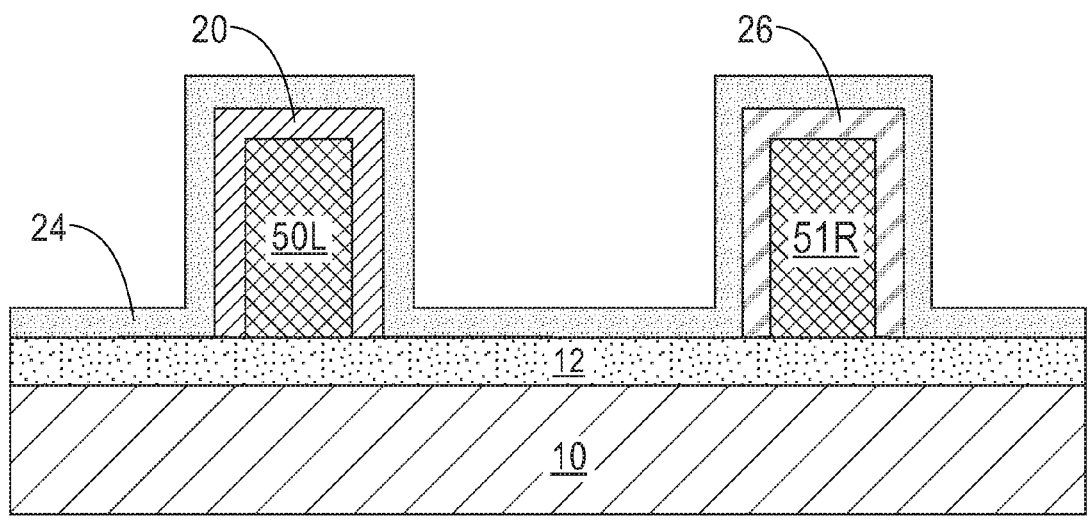
FIG. 18 is a cross sectional view of the second exemplary semiconductor structure of FIG. 17 after performing thermal condensation which converts the epitaxial SiGe layer into a silicon oxide layer and converts the second semiconductor fin into a germanium-containing semiconductor fin.

Referring now to FIG. 18, there is illustrated the second exemplary semiconductor structure of FIG. 17 after performing thermal condensation which converts the epitaxial SiGe layer 22 into a silicon oxide layer 26 and converts the second semiconductor fin 50R into a germanium-containing semiconductor fin 51R. The thermal condensation process that is used in this embodiment is the same as the thermal condensation process that was mentioned above in providing the structure shown in FIG. 6 of the present application.

Figure 19:
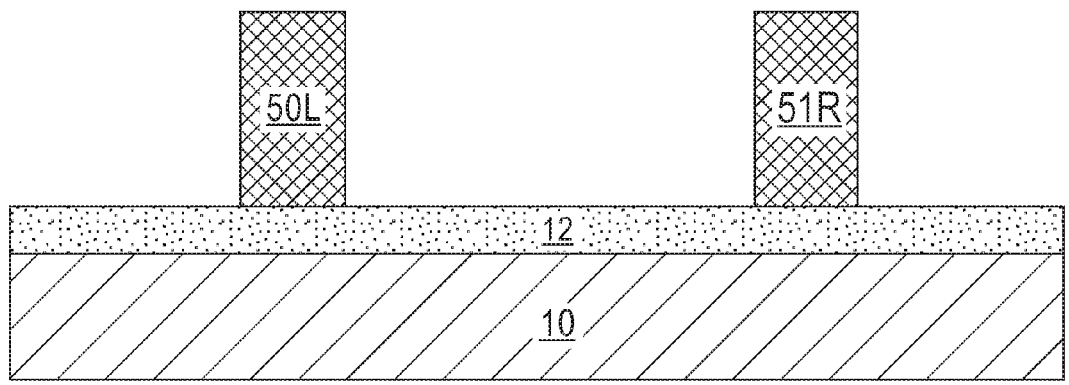
FIG. 19 is a cross sectional view of the second exemplary semiconductor structure of FIG. 18 after removing the oxygen permeable hard mask, the oxygen impermeable hard mask and the silicon oxide layer from the structure.

Referring now to FIG. 19, there is illustrated the second exemplary semiconductor structure of FIG. 18 after removing the oxygen permeable hard mask 24, the oxygen impermeable hard mask 20 and the silicon oxide layer 26 from the structure. The removal of the oxygen permeable hard mask 24, the oxygen impermeable hard mask 20 and the silicon oxide layer 26 from the structure shown in FIG. 18 is the same as described above in providing the structure shown in FIG. 7 of the present application.

Figure 20:
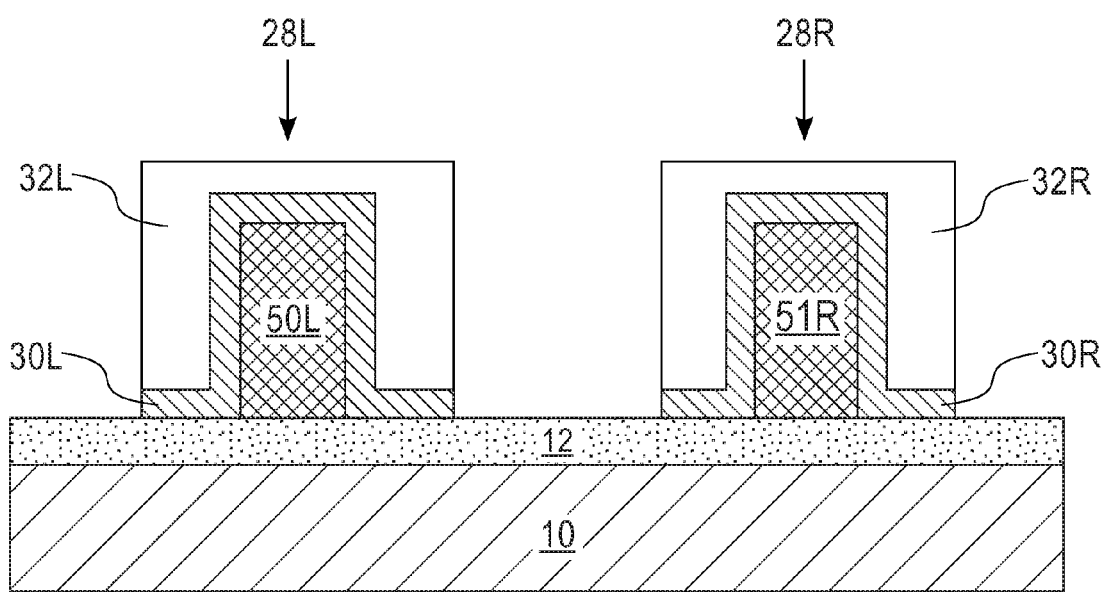
FIG. 20 is a cross sectional view of the second exemplary semiconductor structure of FIG. 19 after forming a first functional gate structure straddling the first semiconductor fin and a second functional gate structure straddling the germanium-containing semiconductor fin.

Referring now to FIG. 20, there is illustrated the second exemplary semiconductor structure of FIG. 19 after forming a first gate structure straddling the first semiconductor fin 50L and a second gate structure straddling the germanium-containing semiconductor fin 51R. In the embodiment illustrated, the first gate structure is a first functional gate structure 28L, and the second gate structure is a second functional gate structure 28R. Each functional gate structure 28L, 28R may include a gate dielectric portion 30L, 30R and a gate conductor portion 32L, 32R. The gate dielectric portions 30L, 30R and the gate dielectric portions 32L, 32 are the same as described in the previous embodiment of the present application. In some embodiments, the first functional gate structure 28L is of a different polarity than the second functional gate structure 28R. For example, the first functional gate structure 28L is an n-type FinFET that has a body portion that is comprised of the first semiconductor fin 50L, while the second functional gate structure 28R is a p-type FinFET that has a body portion comprised of the germanium containing fin portion 51R. In some embodiments (not shown), at least one of the gate structures is a sacrificial gate structure.

After providing the structure shown in FIG. 20, conventional FinFET processing including spacer formation and formation of source/drain regions within exposed portions of each semiconductor fin (not covered by spacer material and a gate structure) can be performed providing a FinFET structure. In the drawings of the present application, the source/drain regions would be located in a portion of each semiconductor fin 50L, 50R that runs into and out of the page of the drawing. When at least one sacrificial gate structure, the sacrificial gate structure may be replaced with a functional gate structure after formation of the spacer.

While the present application has been particularly shown and described with respect to various embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of forming a semiconductor structure comprising:
   providing a structure including a first semiconductor material portion and a second semiconductor material portion located on a surface of a substrate;
   forming an oxygen impermeable hard mask directly on a surface of said first semiconductor material portion, but not said second semiconductor material portion;
   epitaxially forming a silicon germanium layer directly contacting at least a topmost surface of said second semiconductor material portion;
   forming an oxygen permeable hard mask continuously over said first and second semiconductor material portions, wherein a first portion of said oxygen permeable hard mask is formed directly on exposed surfaces of said oxygen impermeable hard mask and a second portion of said oxygen permeable hard mask is formed directly on exposed surfaces of said silicon germanium layer;
   performing a thermal condensation process, wherein during said thermal condensation process oxygen diffuses through said oxygen permeable hard mask and said second semiconductor material portion is converted into a germanium-containing semiconductor material portion, and wherein said oxygen permeable hard mask prevents agglomeration of said first semiconductor material portion, said silicon germanium layer and said second semiconductor material portion during said thermal condensation process; and
   removing said oxygen permeable hard mask and said oxygen impermeable hard mask from said structure.

2. The method of claim 1, wherein said providing said structure including said first semiconductor material portion and said second semiconductor material portion comprises:
   providing a semiconductor-on-insulator substrate or a bulk semiconductor substrate; and
   forming at least one trench into a semiconductor material layer of said semiconductor-on-insulator substrate or a bulk semiconductor substrate by lithography and etching.

3. The method of claim 2, further comprising:
   filling said at least one trench with a trench dielectric material; and
   performing a planarization process.

4. The method of claim 1, wherein first semiconductor material portion and said second semiconductor material portion are semiconductor fins and said silicon germanium layer is formed on a topmost surface and sidewall surfaces of each semiconductor fin that provides the second semiconductor material portion, and said providing said structure comprises:
   providing a semiconductor-on-insulator substrate or a bulk semiconductor substrate; and
   forming said semiconductor fins by lithography and etching.

5. The method of claim 1, wherein said forming said oxygen impermeable hard mask comprises:
   depositing an oxygen impermeable hard mask material over the entire structure; and
   patterning said oxygen impermeable hard mask material by lithography and etching.

6. The method of claim 5, wherein said oxygen impermeable hard mask material is a dielectric nitride material.

7. The method of claim 1, wherein said epitaxially forming said silicon germanium layer comprises an epitaxial deposition process.

8. The method of claim 1, wherein said forming said oxygen permeable hard mask over said first and second semiconductor material portions comprises:
   depositing an oxygen permeable hard mask material.

9. The method of claim 8, wherein said oxygen permeable hard mask material is a dielectric oxide material.

10. The method of claim 1, wherein said performing said thermal condensation process comprises:
    heating the structure at a temperature from 700° C. to 1300° C. and in an oxidizing ambient.

11. The method of claim 10, wherein said at least one oxygen-containing gas is selected from the group consisting of $O_2$, NO, $N_2O$, ozone, and air.

12. The method of claim 1, wherein during said thermal condensation process said SiGe layer is converted to a silicon oxide layer.

13. The method of claim 12, further comprising removing said silicon oxide layer after said thermal condensation process.

14. The method of claim 1, wherein said first semiconductor material and second semiconductor material portion comprise Si, and said germanium-containing semiconductor material portion comprises SiGe.

15. The method of claim 1, wherein second semiconductor material portion comprises SiGe, and said germanium-containing semiconductor material portion comprises SiGe having a higher content of germanium than said second semiconductor material portion.

16. The method of claim 1, wherein said removing said oxygen permeable hard mask and said oxygen impermeable hard mask from said structure comprises one of etching and planarization.

17. The method of claim 1, further comprising forming a first functional gate structure atop said first semiconductor material portion and a second functional gate structure atop said germanium-containing semiconductor material portion.

18. The method of claim 17, wherein said forming said first functional gate structure and said second functional gate structure comprises first forming a first sacrificial gate structure on said first semiconductor portion and a second sacrificial gate structure on said germanium-containing semiconductor material portion, and thereafter replacing said first sacrificial gate structure on said first semiconductor portion with said first functional gate structure and replacing said second sacrificial gate structure on said germanium-containing semiconductor material portion with said second functional gate structure.

19. The method of claim 17, wherein said first functional gate structure is an nFET and said second functional gate structure is a pFET.

20. The method of claim 1, wherein said oxygen permeable hard mask has a dielectric constant that is less than silicon oxide.

* * * * *